United States Patent [19]

Nishimura et al.

[11] Patent Number: 5,488,254

[45] Date of Patent: Jan. 30, 1996

[54] PLASTIC-MOLDED-TYPE SEMICONDUCTOR DEVICE

[75] Inventors: Asao Nishimura, Ushiku; Makoto Kitano, Tsuchiura; Ichio Shimizu, Gunma, all of Japan

[73] Assignee: Hitachi, Ltd., Tokyo, Japan

[21] Appl. No.: 219,742

[22] Filed: Mar. 29, 1994

Related U.S. Application Data

[63] Continuation of Ser. No. 924,449, Aug. 4, 1992.

[30] Foreign Application Priority Data

Aug. 5, 1991 [JP] Japan .................................. 3-195505

[51] Int. Cl.$^6$ ............................ H01L 23/48; H01L 23/02
[52] U.S. Cl. ...................... 257/707; 257/675; 257/706; 257/712; 257/719; 361/688; 361/709; 361/711
[58] Field of Search ..................... 257/675, 706, 257/707, 712, 719; 361/688, 709, 711

[56] References Cited

U.S. PATENT DOCUMENTS

| 4,345,267 | 8/1982 | Corman et al. . | |
| 4,819,041 | 4/1989 | Redmond | 257/712 |
| 5,057,906 | 10/1991 | Ishigami | 357/80 |
| 5,073,817 | 12/1991 | Ueda | 357/81 |
| 5,105,259 | 4/1992 | McShane et al. . | |

FOREIGN PATENT DOCUMENTS

| 59-28364 | 2/1984 | Japan . |
| 60-165745 | 8/1985 | Japan . |
| 2-238652 | 9/1990 | Japan . |
| 3-57252 | 3/1991 | Japan . |

*Primary Examiner*—Rolf Hille
*Assistant Examiner*—Valencia Martin Wallace
*Attorney, Agent, or Firm*—Antonelli, Terry, Stout & Kraus

[57] ABSTRACT

A plastic-molded-type semiconductor device is designed to prevent interfaces of a heat conductive member for heat radiation and plastic encapsulant from being separated from each other. The device is of a structure in which the heat conductive member for heat radiation is provided on and thermally connected to one side of a semiconductor chip, and the whole chip and the whole or a part of side surfaces of the heat conductive member are covered with the resin, the opposite side of the heat conductive member being exposed. In this structure, that portion of the heat conductive member which is covered with the resin has a cross-section whose configuration is any one of a circle, an ellipse, a polygon with corner portions whose internal angle is less than 180 degrees and a dull angle or which are rounded to have a low curvature. With this structure, shearing stress which acts on the adhesion interfaces between the heat conductive member and the resin can be decreased, and also, tightening force from the resin which is exerted on the side surfaces of the heat conductive member can be made uniform, so that separation of the adhesion interfaces can be prevented.

21 Claims, 8 Drawing Sheets

F I G. 3
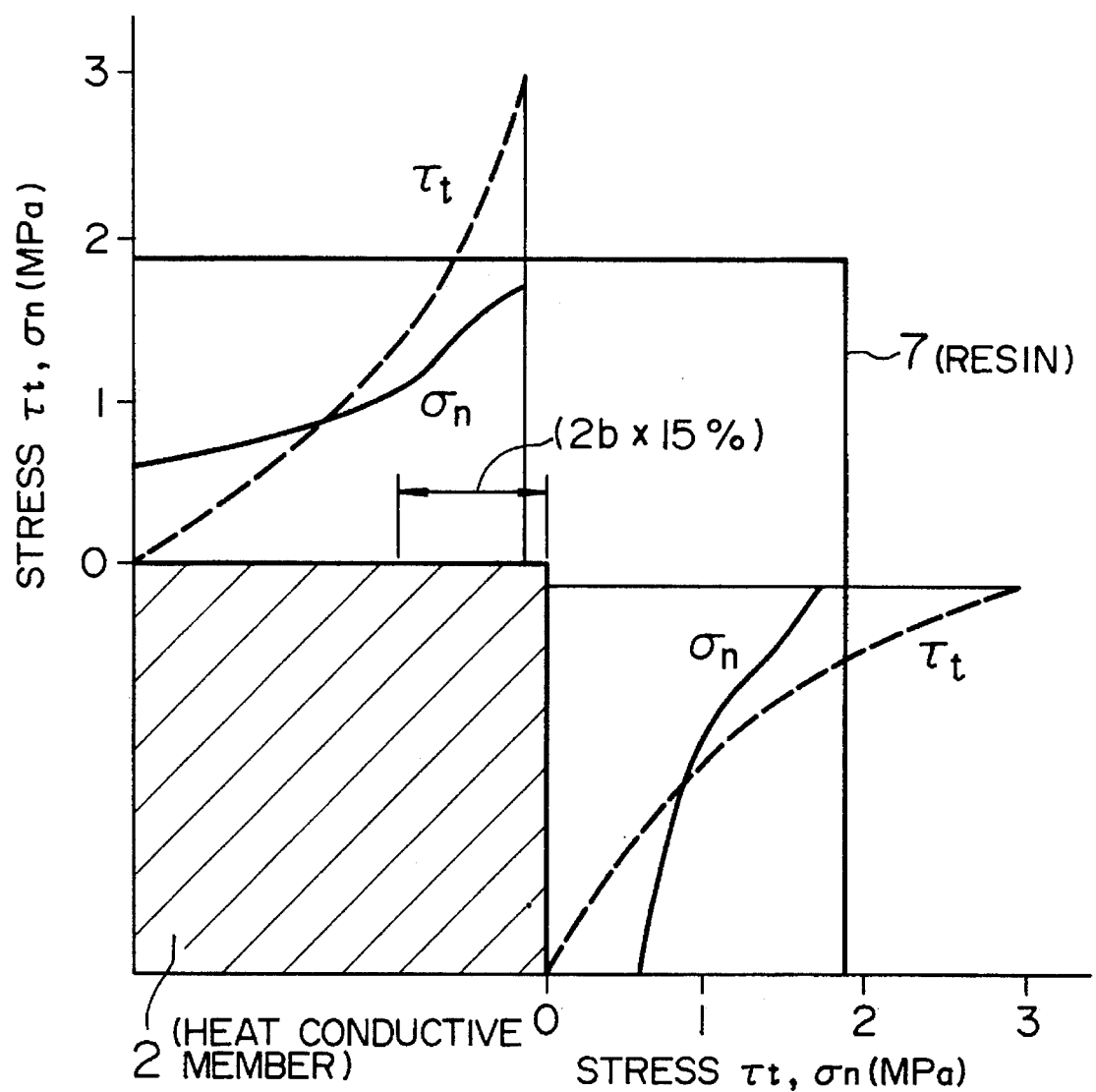

PLASTIC-MOLDED-TYPE SEMICONDUCTOR DEVICE

This application is a continuation of application Ser. No. 07/924,449, filed on Aug. 4, 1992.

BACKGROUND OF THE INVENTION

1. Industrial Field of the Invention

The present invention relates to a plastic-molded-type semiconductor device and, more particularly, to a structure in which there is effected a connection between that of a heat conductive member for heat radiation and a plastic encapsulant.

2. Description of the Prior Art

In a semiconductor device, the amount of heat generated from a chip tends to be increased in accordance with a higher level of device integration. In order to ensure the reliability of the device to obtain favorable electro-properties, however, heat generated from the chip must be radiated out of the device effectively to thereby maintain the temperature of the chip at not more than a certain level. However, plastic-molded-type semiconductor devices, which represent the majority of semiconductor devices, are less efficient in heat radiation because the thermal conductivity of resin is much lower than that of a metallic or ceramic material. According to a known and conventional scheme, a semiconductor device is designed to employ a heat conductive member having a high thermal conductivity and which is thermally connected on one side thereof to a chip while the opposing surface of this member is exposed from the surface of the plastic encapsulant. This type of device which enhances the heat radiation efficiency of the plastic-molded-type semiconductor device is disclosed in Japanese Patent Unexamined Publication Nos. 59-28364 and 60-165745.

In each of the above-described conventional examples, the heat conductive member for heat radiation is adhered to the chip and, also, it is exposed out of the plastic encapsulant. However, when the adhesion interfaces between the side surfaces of the heat conductive member and the plastic encapsulant become separated, the moisture in the environment will permeate through the interfaces and reach the chip easily. In case moisture does reach the chips in this manner, the function of the chip will be damaged, for example, fine aluminum wiring on the surface of the chip will be corroded.

In general, the cross-sectional configuration of that portion of the heat conductive member at the portion where the member is covered with the resin, especially at the same level as the surface of the resin, is a polygon such as a square and a rectangle corresponding to the shape of the chip. However, the heat conductive member is usually made of a metallic or ceramic material and, consequently, its linear expansion coefficient is smaller than that of the plastic encapsulant. Such differences in the expansion coefficients leads to a difference between linear expansions of these component parts. Therefore, high shearing stress is generated particularly at corner portions of the adhesion interfaces between the heat conductive member having a polygonal cross-sectional configuration and the plastic encapsulant, which results in a problem that interfacial separation is likely to occur.

Moreover, since the linear expansion coefficient of the heat conductive member is smaller than that of the plastic encapsulant, the resin is constructed by a larger degree when the resin is cooled from the mold temperature to the ordinary temperature, and tightening force from the resin is exerted on the side surfaces of the heat conductive member. Such stress for compressing the adhesion interfaces serves to prevent interfacial separation or generation of a gap.

However, when the polygonal heat conductive member is embedded in the resin, the tightening force from the resin is concentrated in the vicinity of the corner portions of the heat conductive member and hardly exerted on central portions of its sides. Further, even tensile stress develops in some cases. Consequently, the conventional plastic-molded-type semiconductor device including the polygonal heat conductive member involves a problem that it is difficult to obtain adequate plastic molded reliability because separation of the adhesion interfaces between the heat conductive member and the resin is apt to take place.

SUMMARY OF THE INVENTION

It is therefore an object of the present invention to provide a plastic-molded-type semiconductor device having high encapsulation reliability by preventing interfaces (e.g., the contacting surfaces) between a heat conductive member for heat radiation and plastic encapsulant from being separated from each other.

In order to achieve the above-described object, the invention provides a plastic-molded-type semiconductor device comprising a structure in which a heat conductive member for heat radiation is provided on and thermally connected on one side thereof to one side of a chip, and the whole chip and the whole or a part of side surfaces of the heat conductive member are covered with resin while the opposing side of the heat conductive member is exposed, wherein that portion of the heat conductive member which is covered with the resin has a cross-section, substantially in parallel to the chip, whose configuration is any one of a circle, an ellipse, a polygon with corner portions whose internal angle is less than 180 degrees and a dull angle, and another polygon with corner portions whose internal angle is less than 180 degrees and which are rounded to have a low curvature.

Further, in the case where the cross-sectional configuration of the heat conductive member is a rectangle with corner portions whose internal angle is less than 180 degrees and which are rounded to have a low curvature, the curvature radius of the rounded portions should preferably be 15% or more of the longest side or the maximum width of the rectangle.

Moreover, the heat conductive member should preferably be thermally connected to that surface of the chip opposite the side thereof on which the circuit is formed, i.e. the rear surface of the chip. In this case, that surface of the heat conductive member which is thermally connected to the chip should preferably be at least larger than the planar configuration of the chip.

Furthermore, the heat conductive member should preferably be thermally connected to lead terminals which are electrically connected to the chip and drawn out of the resin.

According to the invention with the above-described structure, the cross-sectional configuration of that portion of the heat conductive member which is covered with the plastic encapsulant is a circle or an ellipse having no corner portions or a polygon with corner portions whose internal angle is less than 180 degrees and a dull angle or a polygon with corner portions whose internal angle is less than 180 degrees and which are rounded to have a low curvature. Therefore, shearing stress at the corner portions which acts on the adhesion interfaces can be decreased and, also, a tightening force from the resin which is exerted on the side surfaces of the heat conductive member can be made uniform. It is thus possible to prevent separation of the adhesion interfaces between the heat conductive member and the resin. As a result, there can be solved that problem in which the function of the chip becomes damaged by the moisture permeated into the device through the adhesion interfaces.

BRIEF DESCRIPTION OF THE DRAWINGS

FIG. 3 is a diagram showing a stress distribution on adhesion interfaces between a heat conductive member and resin in a conventional plastic-molded-type semiconductor device for the purpose of comparison with FIG. 2;

DETAILED DESCRIPTION OF THE PREFERRED EMBODIMENTS

The preferred embodiments of the present invention will be hereinafter described with reference to the attached drawings.

Figure 1:
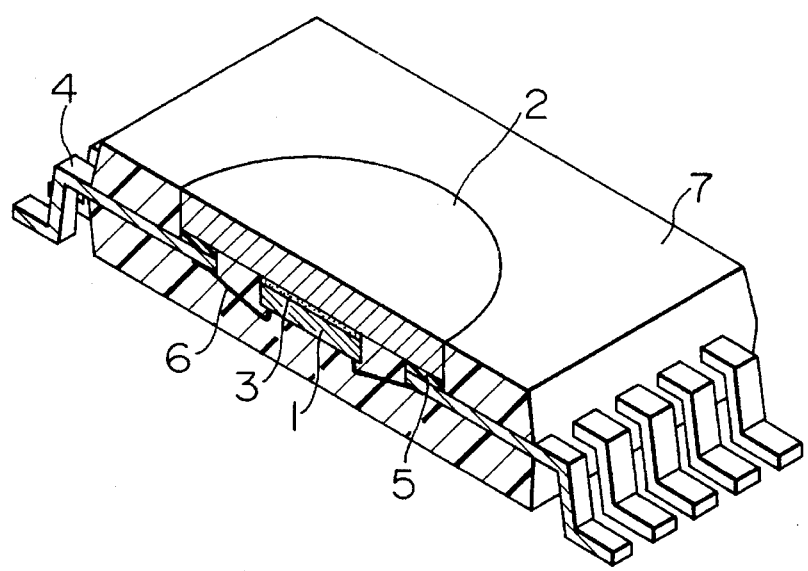
FIG. 1 is a partial cross-sectional perspective view of a plastic-molded-type semiconductor device according to one embodiment of the present invention.

FIG. 1 is a partial cross-sectional perspective view of a plastic-molded-type semiconductor device according to one embodiment of the invention. A chip 1 is securely fixed on the lower surface of a disk-like heat conductive member 2 by an adhesive 3 or the like, with the circuit surface of that chip 1 on which the circuit is formed being oriented downwardly. The heat conductive member 2 is made of a material having high heat conductivity, such as a metallic or ceramic material, and thermally connected to the chip 1 through the adhesive 3. Lead terminals 4 for connection with the outside circuits are adhered to the heat conductive member 2 through insulating members 5, and electrically connected with electrodes formed on the circuit surface of the chip 1 by way of fine metallic wiring 6. These members are embedded in molded resin 7 except for the upper surface of the heat conductive member 2 and connector portions of the lead terminals 4. In other words, the upper surface of the heat conductive member 2 is exposed from the surface of the resin 7, and also, those portions of the lead terminals 4 which are drawn out of the resin 7 are shaped to have a certain configuration, as shown in FIG. 1, so as to be connected to a printed wiring substrate or the like on which this semiconductor device is to be mounted.

Figure 2:
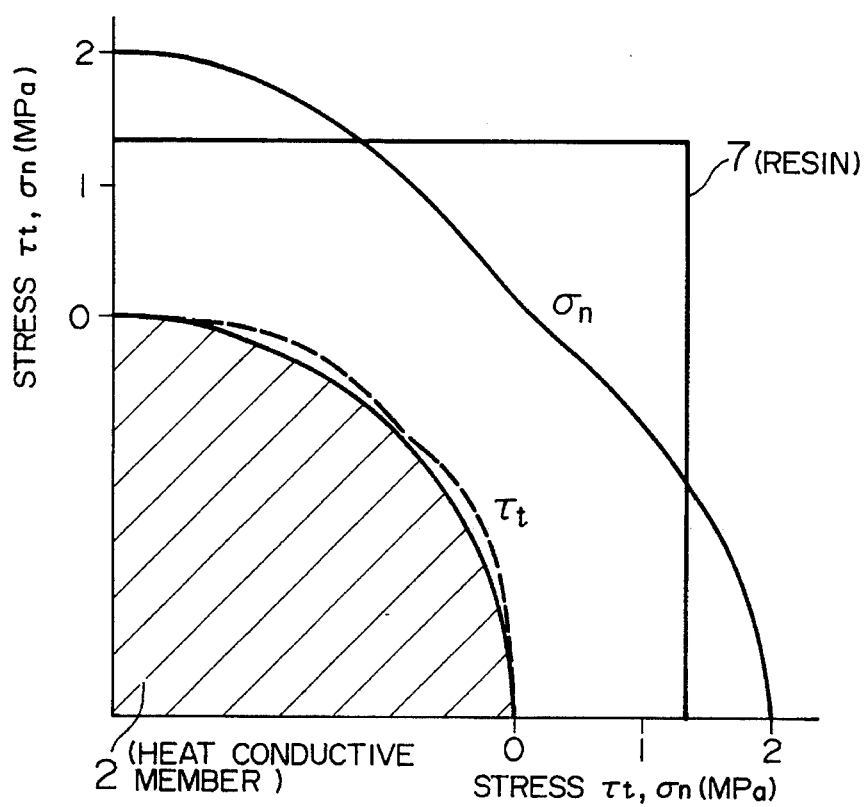
FIG. 2 is a diagram showing a stress distribution on adhesion interfaces of a heat conductive member and resin in the plastic-molded-type semiconductor device according to the embodiment of FIG. 1.

Now, a stress distribution on adhesion interfaces of the heat conductive member 2 and the resin 7, according to this embodiment, will be described in comparison with a conventional example in which a heat conductive member having a polygonal cross-section is employed. FIG. 2 shows a result of analysis of a stress distribution on an outer peripheral side surface of the heat conductive member 2 when the disk-like heat conductive member 2 of this embodiment is used in the plastic-molded-type semiconductor device whose planar configuration is square, i.e., stress distribution on adhesion interfaces between the heat conductive member 2 and the resin 7. For the purpose of comparison, FIG. 3 shows a result of analysis of stress distribution on outer peripheral side surfaces of the heat conductive member when the conventional square heat conductive member is used. It should be noted that these diagrams illustrate only a quarter of the planar configuration in consideration of symmetric property of the planar configuration of the heat conductive member and others, while showing a distribution of shearing stress τt in the tangential direction along the outer peripheral surface of the heat conductive member 2 and a distribution of compressive stress σn in the normal direction of the outer peripheral surface. The heat conductive member 2 is made of copper, and the resin 7 is an epoxy resin filled with silica particles.

In the conventional example shown in FIG. 3 with the square heat conductive member, high shearing stress τt is generated at each corner portion of the square, and compressive stress σn at the center of each side is low. On the other hand, in the embodiment shown in FIG. 2 with the disk-like heat conductive member 2, shearing stress τt all over the outer periphery of the heat conductive member 2 is extremely low, and compressive stress σn is uniformly high. In this embodiment, therefore, separation of the adhesion interfaces between the heat conductive member 2 and the resin 7 will not easily occur, so that high encapsulation reliability can be obtained.

In the above comparison, the analysis is performed on the condition that the coefficient of linear expansion of the resin 7 is larger than that of the heat conductive member 2. In the case of a combination of materials such that this relationship is reversed, a tightening force does not result on the outer peripheral portion of the heat conductive member 2 from the resin 7 so that the interfacial separation is apt to occur. Consequently, such a material combination should preferably be avoided.

In the embodiment shown in FIG. 1, the heat conductive member 2 serves to transmit heat generated from the chip 1 to a wide area on the top surface of the semiconductor device, thereby promoting heat radiation from the top surface. At the same time, it serves to make heat conduction between the chip 1 and the lead terminals 4 favorable and to promote heat radiation to the above-mentioned printed wiring substrate by way of the lead terminals 4. In order to improve the efficiency of heat radiation from the top surface of the semiconductor device toward the surrounding air to a further extent, as publicly known, it is preferred to shape the upper surface of the heat conductive member 2 like fins or to attach a fin-like radiator on the upper surface of the disk-like heat conductive member 2 after resin molding.

In FIG. 1, the lead terminals 4 are bent downwardly to be connected to the printed wiring substrate at the lower side of the figure, and the exposed surface of the heat conductive member 2 is located on the side far from the printed wiring substrate. However, the lead terminals 4 may be bent in the opposite direction so that the exposed surface of the heat conductive member 2 is located to face the wiring board. In this case, in addition to a packaging method in which heat is transferred to the air by passing the air between the semiconductor device and the printed wiring substrate, it is possible to employ a packaging method in which heat is transferred to the printed wiring substrate through a thin layer of the air. In the latter case, the heat radiation efficiency can be further improved by interposing a highly heat conductive material such as heat conductive grease in a gap between the semiconductor device and the wiring substrate.

As described above, a highly heat conductive metallic material such as copper and aluminum is suitable for the heat conductive member 2. Other than such materials, however, other metallic materials or ceramic materials of various kinds can be used so long as the thermal conductivity is higher than that of the resin 7. When an insulating material such as a ceramic material is used for the heat conductive member 2, the insulating members 5 between the heat conductive member 2 and the lead terminals 4 can be omitted. The exposed surface of the heat conductive member 2 need not be always made of the same material as the inside. Metal plating or non-metallic coating of a thickness so as not to interfere with the heat conduction may be carried out to thereby improve the corrosion resistance of the heat conductive member 2 itself and the closeness or adhesiveness with other radiators or the like. The adhesive 3 used for adhesion/fixing of the heat conductive member 2 and the chip 1 should preferably be an adhesive of epoxy, polyimide or silicone base having high heat resistance, or an adhesive of this kind mixed with highly heat conductive particles such as silver powder and silica powder. These members can be fixed on each other by soldering or gold-silicon eutectic bonding without using the adhesive 3.

The lead terminals 4 are integrally formed in a lead frame which is usually made of a thin metallic sheet of copper, copper alloy, iron-nickel alloy or the like having a thickness of about 100 to 500 μm, and the terminals are cut off from each other after resin molding. The lead terminals 4 may be drawn out of the resin 7 in all the four directions from the sides of the cubic resin 7 or in one to three of the directions.

The resin 7 should preferably be a polymeric material such as epoxy, polyimide or the like filled with highly heat conductive particles, e.g., silica powder or alumina powder.

Figure 4:
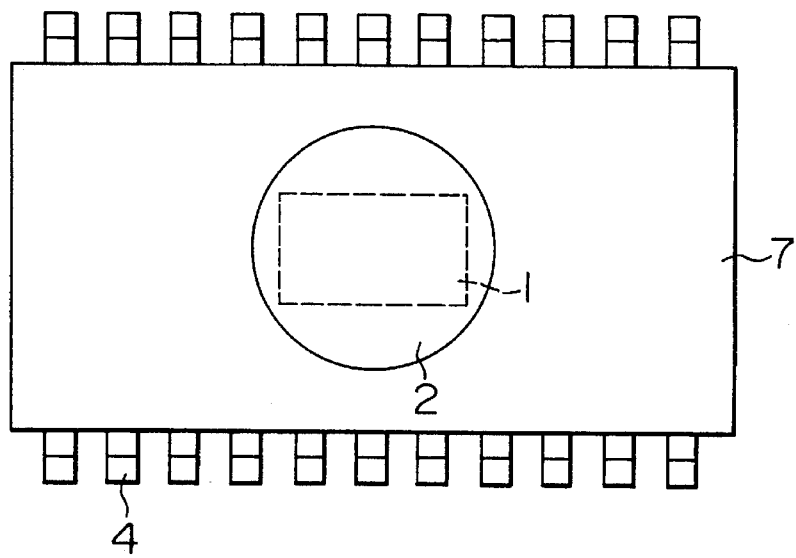
FIG. 4 is a plan view of one embodiment in which the invention is applied to a plastic-molded-type semiconductor device including a rectangular semiconductor substrate.

FIG. 4 is a plan view of a plastic-molded-type semiconductor device according to another embodiment of the invention. The contour of a chip 1 which is located below a heat conductive member 2 is depicted with a dashed line. In this embodiment, the chip 1 and resin 7 have rectangular configurations. In such a case as well, the heat conductive member 2 is shaped like a disk which is larger than the circumscribed circle of the chip 1 and smaller than the inscribed circle of the outer configuration of the resin 7. However, it is unfavorable for the outer periphery of the heat conductive member 2 to be located extremely close to the side surfaces of the resin 7. The reason will be explained with reference to FIG. 5. The diagram shows a result of stress analysis in the case where a large-sized disk-like heat conductive member 2 is used in a plastic-molded-type semiconductor device whose planar configuration is rectangular. Although it is similar to the disk-like heat conductive member shown in FIG. 2, normal compressive stress σn is almost zero between the heat conductive member 2 and the resin 7 at a portion 2a of the adhesion interface which is close to a longitudinal side surface of the resin 7, and shearing stress τt is larger at a portion of the adhesion interface farther from that portion. Although the heat conductive member 2 has a shape of rotation symmetry, the outer configuration of the resin 7 is not of rotation symmetry. Consequently, a stress distribution of non-uniformity is undesirably generated at the adhesion interface between the heat conductive member 2 and the resin 7. In respect of the encapsulation reliability, therefore, it is preferred to shape the resin like a disk although it involves in problems in the manufacturing procedure and board mounting.

Figure 5:
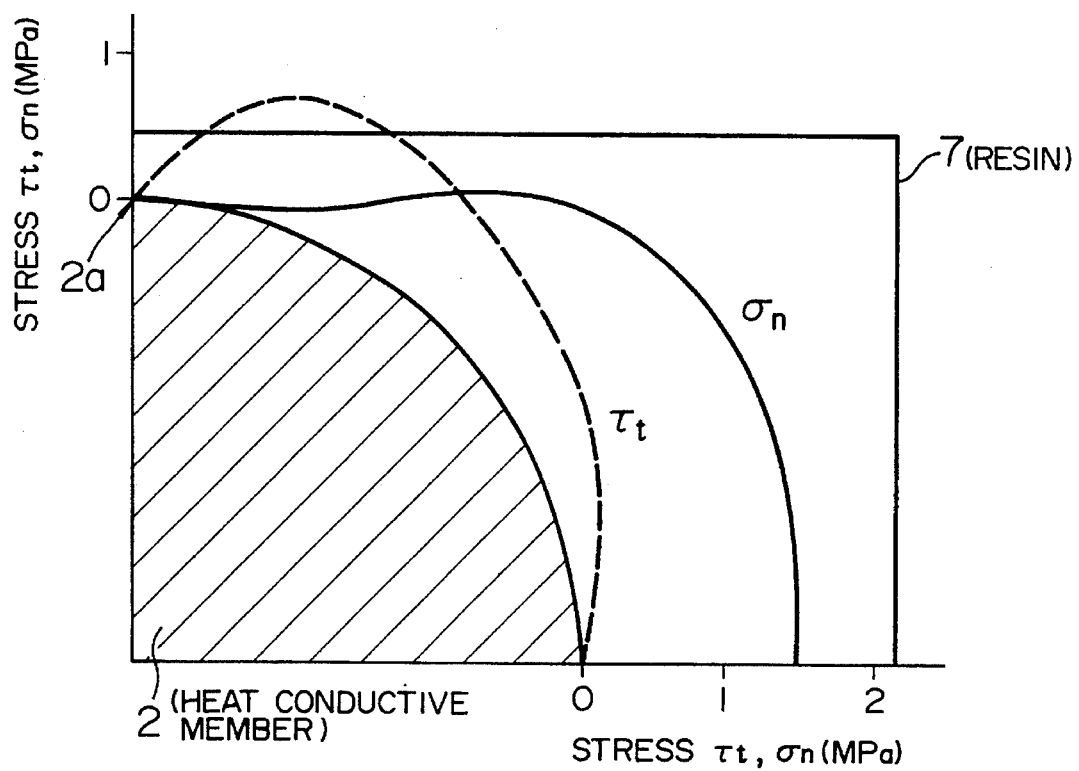
FIG. 5 is a diagram showing a stress distribution on adhesion interfaces between a heat conductive member and resin in the embodiment of FIG. 4 when the heat conductive member is enlarged so that a side surface of its outer periphery is located close to the side surfaces of the outer periphery of the resin.
Figure 6:
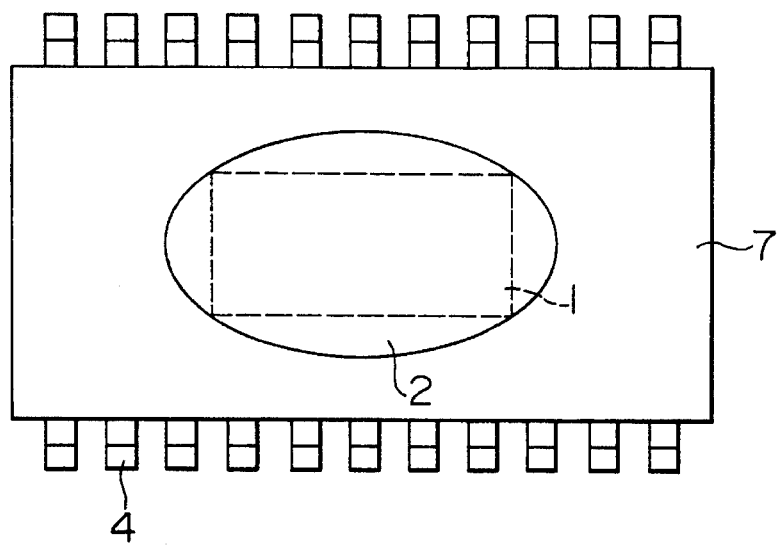
FIG. 6 is a plan view of a plastic-molded-type semiconductor device according to one embodiment of the invention including a heat conductive member whose cross-sectional configuration is an ellipse and a chip whose planar configuration is that of an elongated rectangle.
Figure 7:
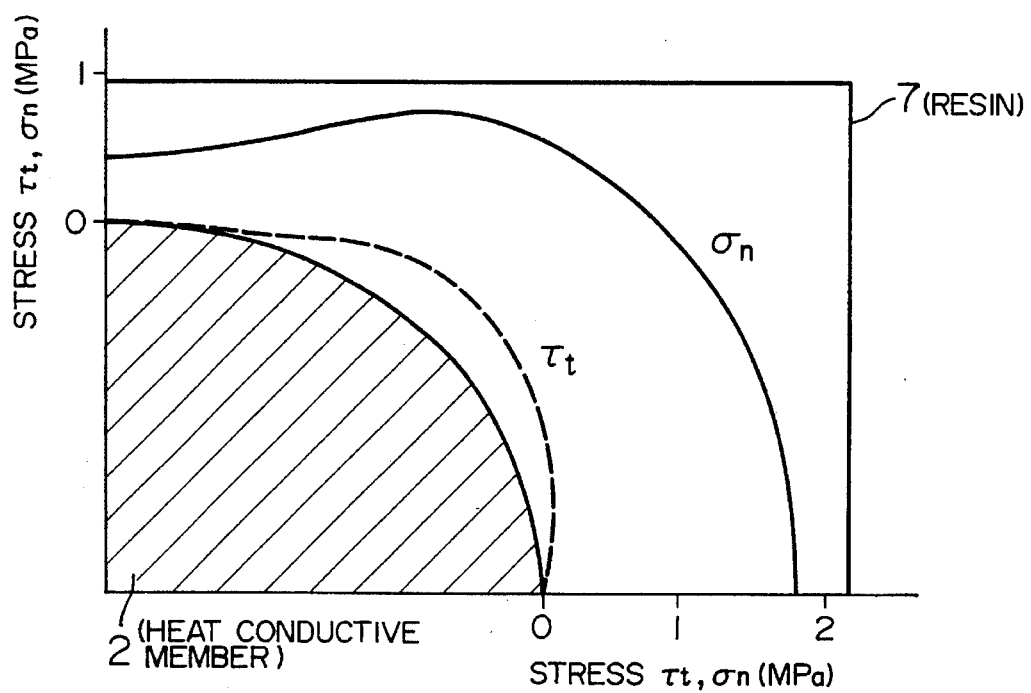
FIG. 7 is a diagram showing a stress distribution on adhesion interfaces between the heat conductive member and resin in the embodiment of FIG. 6.

FIG. 6 shows one embodiment in which a chip 1 has a rectangular shape longer than that shown in FIG. 5. In this embodiment, as shown in the figure, by use of an elliptic disk-like heat conductive member 2, the outer periphery of the heat conductive member 2 is prevented from being located extremely close to the side surfaces of resin 7. FIG. 7 shows a result of analysis of stress at the outer peripheral portion of the heat conductive member 2 according to this embodiment. In comparison with the embodiments shown in FIGS. 3 and 5, shearing stress τt is smaller, and normal compressive stress σn is substantially uniform. According to this embodiment, therefore, high encapsulation reliability can be obtained even in the case of a large-sized rectangular chip 1 to which a disk-like heat conductive member cannot be applied. Moreover, according to the third embodiment, even if the size of a chip 1 is small, the area of a heat conductive member 2 is enlarged as much as possible by utilizing the rectangular configuration of resin 7 effectively so as to improve the efficiency of heat radiation and to ensure the encapsulation reliability.

Figure 8:
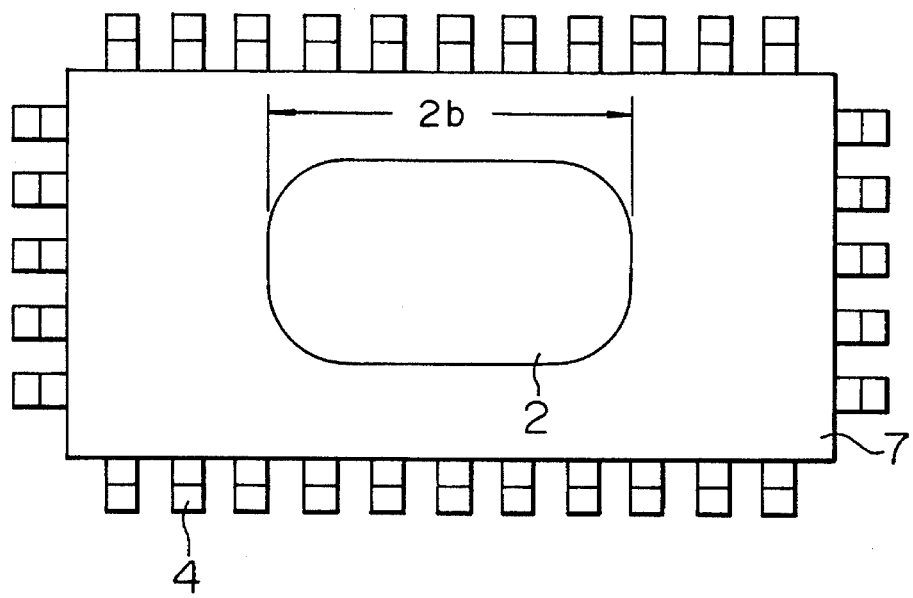
FIG. 8 is a plan view of a plastic-molded-type semiconductor device according to one embodiment of the invention including a heat conductive member whose cross-sectional configuration is a rectangle with corner portions rounded to have an arcuate shape and a chip whose planar configuration is that of an elongated rectangle.

FIG. 8 is a plan view of a plastic-molded-type semiconductor device according to a still other embodiment of the invention. In the figure, the planar configuration of a heat conductive member 2 is a rectangle whose corner portions are rounded to have an arcuate shape of a low curvature. According to this embodiment, although the interfacial separation preventing effect is lower as compared with the embodiments shown in FIGS. 1 and 6, sealing reliability higher than that of the conventional polygonal heat conductive member 2 can be obtained. It should be noted that the configuration of the corner portions need not be strictly arcuate so long as each of the corner portions has an internal angle of not more than 180 degrees and is shaped to be rounded along a gentle curve. However, if the curvature radius of the arcuate curves is too small, the shearing stress decreasing effect and the compressive stress uniforming effect can not be obtained. In the case where reduction of stress concentration at corner portions of the adhesion interface is the primary objective, merely effecting local arcuate shaping can suffice to some extent. However, in order to obtain the effect which the present invention is intended to produce, especially the compressive stress uniforming effect, the minimum value of the curvature radius should preferably be 15% or more of the maximum width $2b$ of the heat conductive member 2 in accordance with the dimension of the region where compressive stress on at the corner portion is drastically changed, as shown in FIG. 3.

Figure 9:
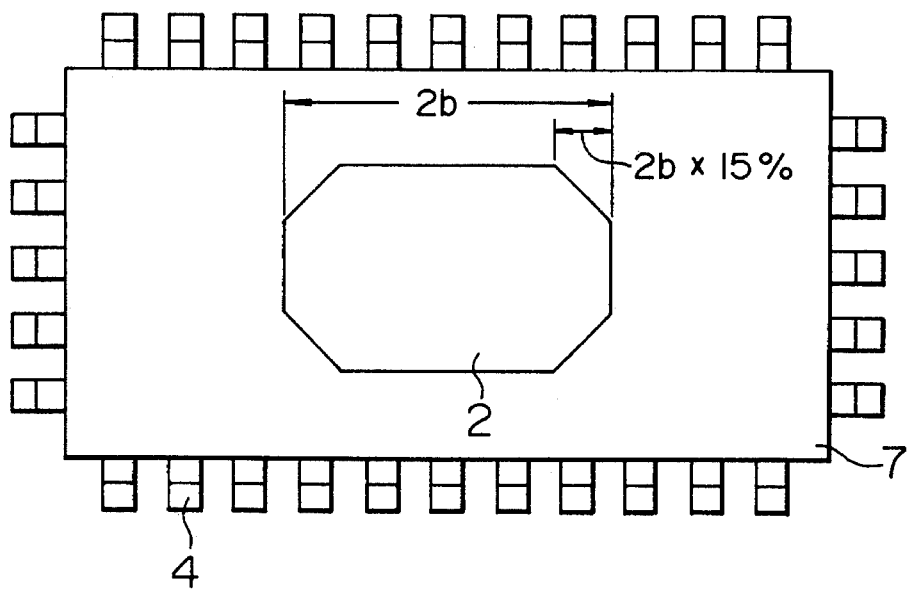
FIG. 9 is a plan view of a plastic-molded-type semiconductor device according to one embodiment of the invention including a heat conductive member whose cross-sectional configuration is a polygon with corner portions bevelled or cut along straight lines and a chip whose planar configuration is that of an elongated rectangle.

FIG. 9 is a plan view of a different embodiment in which corner portions of a heat conductive member 2 are cutoff (e.g., bevelled). In this embodiment, the heat conductive member 2 has an octagonal shape formed by cutting corner portions of a polygon (e.g., rectangle or square). In this manner, even if the planar configuration of the heat conductive member 2 is a polygon all of whose corner portions have dull angles, it is possible to reduce concentration of shearing stress at corner portions and to make uniform compressive stress, as compared with the square heat conductive member 2. In this respect, however, the embodiment shown in FIG. 9 is less effective than the embodiment shown in FIG. 8. Moreover, the polygonal configuration of the heat conductive member 2 is not limited to an octagon. Various kinds of polygons having five corners or more can be applied so long as all the corner portions have dull angles. However, as explained in relation to the arcuate shaping shown in FIG. 8, it is not effective enough if such shaping is performed only in an extremely narrow range. When the corner portions having dull angles are rounded along curves in a manner similar to the embodiment of FIG. 8, interfacial separation can be prevented to a further extent. In the embodiments shown in FIGS. 8 and 9, the planar configuration of the heat conductive member 2 is not restricted to a polygon whose corner portions have the same angle. In the case that the corner portions of the polygon are rounded along a gentle curve, part of the corner portions may have an acute angle slightly smaller than 90 degrees or an angle of 90 degrees.

Figure 10:
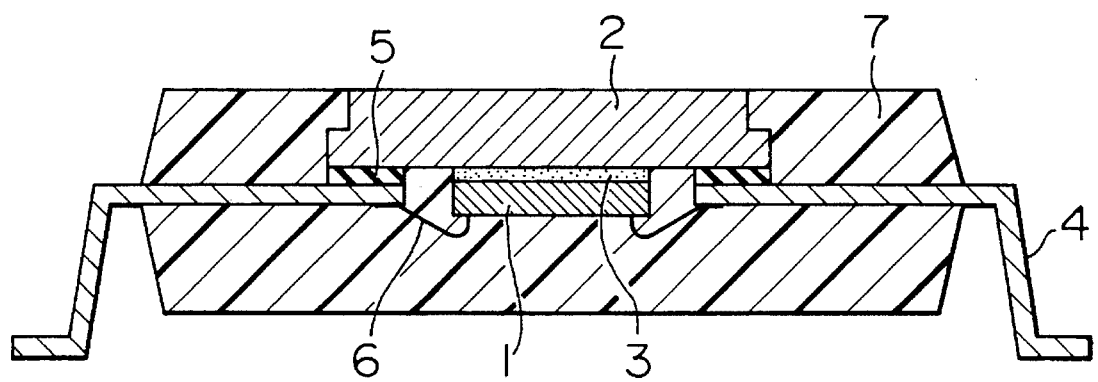
FIG. 10 is a cross-sectional view of one embodiment in which a heat conductive member includes stepped portions at its side surfaces.

FIG. 10 is a cross-sectional view of a plastic-molded-type semiconductor device according to another embodiment of the invention. A heat conductive member 2 not only has substantially the same planar configuration as the above-described embodiments but also includes stepped portions at its side surfaces, as shown in FIG. 10. Thus, the interfacial separation preventing effect can be further enhanced. Even if interfacial separation takes place, permeation passages of the moisture are long to thereby improve the moisture resistance of the semiconductor device.

Figure 11:
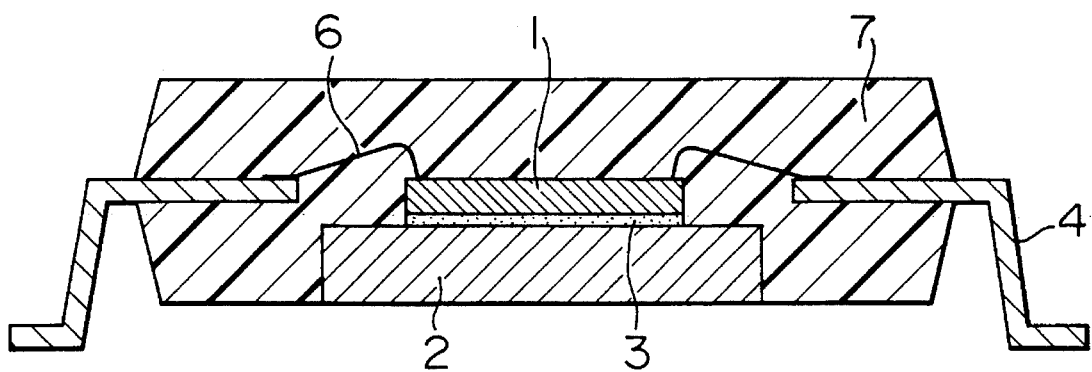
FIG. 11 is a cross-sectional view of one embodiment in which a heat conductive member and lead terminals are not thermally connected.

FIG. 11 is a cross-sectional view of a plastic-molded-type semiconductor device according to another different embodiment of the invention. This embodiment is different from the other embodiments in that a heat conductive member 2 and lead terminals 4 are not thermally connected. Therefore, heat radiation through the lead terminals 4 cannot be expected to be too great. Needless to say, as a planar configuration of the heat conductive member 2, the shapes illustrated in the embodiments of FIGS. 1, 6, 8 and 9 can be employed so as to obtain high encapsulation reliability. Although the heat conductive member 2 is located to face a printed wiring substrate in this embodiment, it can be located in the same manner as the other embodiments as a matter of course.

Figure 12:
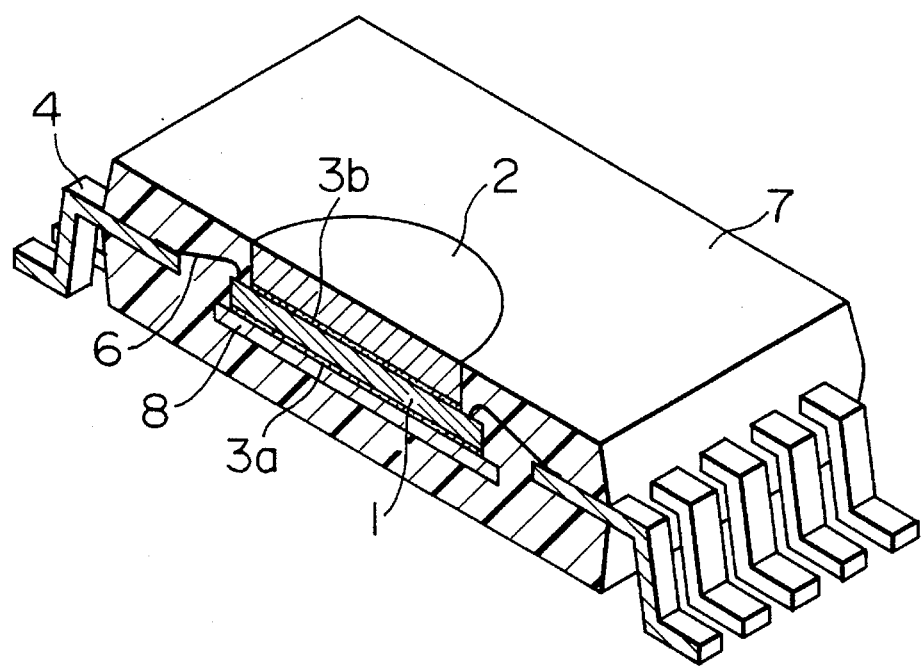
FIG. 12 is a cross-sectional view of one embodiment in which a heat conductive member is adhered on the circuit surface of a semiconductor substrate.

FIG. 12 is a cross-sectional view of a plastic-molded-type semiconductor device according to a still other embodiment of the invention. In this embodiment, by use of an adhesive $3a$ or the like, a chip 1 is securely fixed on a chip pad 8 which is formed in a lead frame as well as lead terminals 4, with the circuit surface of the chip 1 facing upwardly. A heat conductive member 2 is adhered on the circuit surface of the chip 1 by an adhesive $3b$, and the top surface of the heat conductive member 2 is exposed from the surface of resin 7. The adhesive $3b$ for adhering the heat conductive member 2 and the chip 1 need not be always the same as the adhesive $3a$ for adhering the chip pad 8 and the chip 1. Naturally, as a planar configuration of the heat conductive member 2, the shapes illustrated in the embodiments of FIGS. 1, 6, 8 and 9 can be employed so as to obtain high encapsulation reliability. In this case, however, the dimensions of the heat conductive member 2 are limited because it is necessary to obtain a certain area for electric connection by fine metallic wiring 6 on the circuit surface of the chip 1. In consequence, the other embodiments are superior to this one in respect of the heat radiation efficiency.

Figure 13:
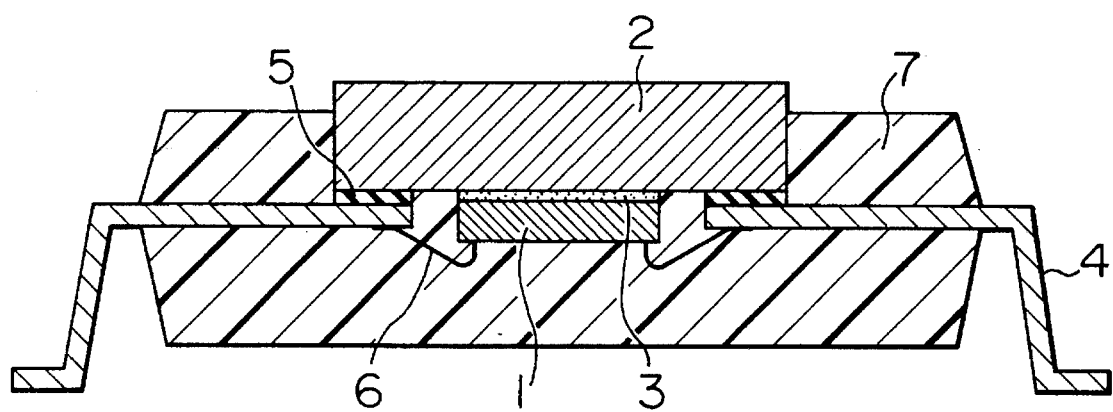
FIG. 13 is a cross-sectional view showing one embodiment in which the exposed surface of a heat conductive member is projected from the outer surface of resin.
Figure 14:
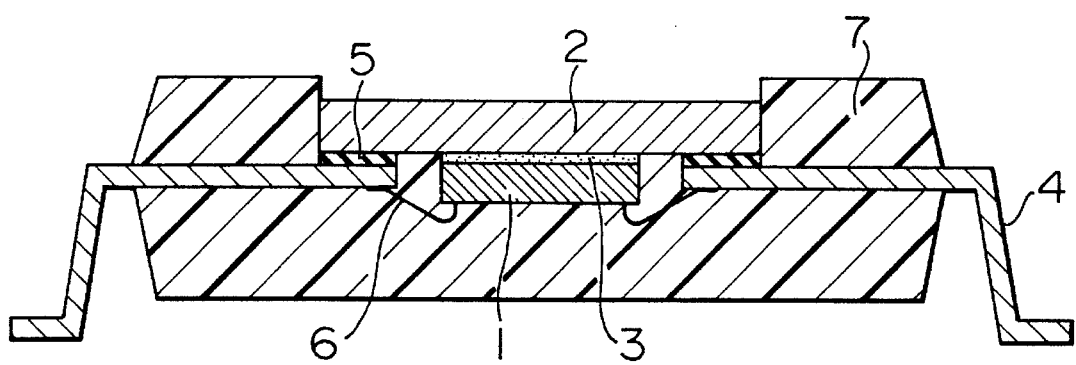
FIG. 14 is a cross-sectional view showing one embodiment in which the exposed surface of a heat conductive member is recessed from the outer surface of resin.

FIGS. 13 and 14 are cross-sectional views each showing a plastic-molded-type semiconductor device according to a further embodiment of the invention. As shown in the figures, the exposed surface of a heat conductive member 2 need not be always at the same level as the surface of surrounding resin 7. It may be projected as shown in FIG. 13 or recessed as shown in FIG. 14. When it is projected as shown in FIG. 13, the heat radiation efficiency is better than that of the embodiment having a flat surface. Moreover, in either of the embodiments shown in FIGS. 13 and 14, it is easier to fix a radiator-like fins and the like securely on the surface of the heat conductive member 2.

According to the present invention, the cross-sectional configuration of that portion of the heat conductive member which is covered with the resin is a circle or an ellipse having no corner portions or a polygon with corner portions whose internal angle is less than 180 degrees and a dull angle or a polygon with corner portions whose internal angle is less than 180 degrees and which are rounded to have a low curvature. Therefore, shearing stress at the corner portions which acts on the adhesion interfaces can be decreased, and also, a tightening force from the resin which is exerted on the side surfaces of the heat conductive member can be made uniform, so that it is possible to prevent separation of the adhesion interfaces between the heat conductive member and the resin. As a result, there can be solved the problem that the function of the chip is damaged by the moisture permeated into the interior of the device through the adhesion interfaces. Thus, high encapsulation reliability can be obtained.

What is claimed is:

1. A plastic-molded-type semiconductor device of a resin sealing type comprising:

a heat conductive member for heat radiation thermally connected to a semiconductor chip, the thermal connection being effected by securely fixing a surface corresponding to one main side of the chip directly to a surface of a side of said heat conductive member facing said one main side of the chip; and a resin for encapsulating the whole chip and the entirety of or part of side surfaces of said heat conductive member while a surface at a side of said heat conductive member opposite the side thereof securely fixed to the chip being exposed, wherein a portion of said heat conductive member which is encapsulated with said resin has a cross-section, substantially in parallel to said one main side of the chip, whose configuration is a polygon in which all corner portions thereof form internal angles of less than 180 degrees and which are dull angles.

2. A plastic-molded-type semiconductor device according to claim 1, wherein the cross-sectional configuration of said heat conductive member is substantially rectangular, and wherein each corner of the rectangular configuration is bevelled such that a length of the longest side of the rectangular configuration is reduced at said each corner by at least 15% of the longest length of the rectangular configuration.

3. A plastic-molded-type semiconductor device according to claim 1 or 2, wherein said one main side of the chip, which is securely fixed to said heat conductive member, corresponds to that side of the chip opposite a side thereof which has at least one circuit.

4. A plastic-molded-type semiconductor device according to claim 3, wherein the surface of said heat conductive member corresponding to the side thereof which is thermally connected to the chip is larger at least than a planar configuration of the chip.

5. A plastic-molded-type semiconductor device according to claim 4, wherein said heat conductive member is thermally connected to lead terminals which are electrically connected to the chip and drawn out of said resin coating.

6. A plastic-molded-type semiconductor device according to claim 2, wherein said heat conductive member is thermally connected to lead terminals which are electrically connected to the chip and drawn out of said resin coating.

7. A plastic-molded-type semiconductor device according to claim 5, wherein said heat conductive member is made of metallic material.

8. A plastic-molded-type semiconductor device according to claim 5, wherein said heat conductive member is made of ceramic material.

9. A plastic-molded-type semiconductor device according to claim 1, wherein said heat conductive member is thermally connected to lead terminals which are electrically connected to the chip and drawn out of said resin coating.

10. A plastic-molded-type semiconductor device according to claim 1, wherein said one main side of the chip is securely fixed directly to said heat conductive member by using an adhesive.

11. A plastic-molded-type semiconductor device according to claim 1, wherein said one main side of the chip is securely fixed directly to said heat conductive member by using a solder.

12. A plastic-molded-type semiconductor device according to claim 1, wherein said one main side of the chip is securely fixed directly to said heat conductive member by using gold-silicon eutectic bonding.

13. A plastic-molded-type semiconductor device according to claim 3, wherein said one main side of the chip is securely fixed directly to said heat conductive member by using an adhesive.

14. A plastic-molded-type semiconductor device according to claim 3, wherein said one main side of the chip is securely fixed directly to said heat conductive member by using a solder.

15. A plastic-molded-type semiconductor device according to claim 3, wherein said one main side of the chip is securely fixed directly to said heat conductive member by using gold-silicon eutectic bonding.

16. A plastic-molded-type semiconductor device according to claim 5, wherein said one main side of the chip is securely fixed directly to said heat conductive member by using an adhesive.

17. A plastic-molded-type semiconductor device according to claim 5, wherein said one main side of the chip is securely fixed directly to said heat conductive member by using a solder.

18. A plastic-molded-type semiconductor device according to claim 5, wherein said one main side of the chip is securely fixed directly to said heat conductive member by using gold-silicon eutectic bonding.

19. A plastic-molded-type semiconductor device according to claim 6, wherein said one main side of the chip is securely fixed directly to said heat conductive member by using an adhesive.

20. A plastic-molded-type semiconductor device according to claim 6, wherein said one main side of the chip is securely fixed directly to said heat conductive member by using a solder.

21. A plastic-molded-type semiconductor device according to claim 6, wherein said one main side of the chip is securely fixed directly to said heat conductive member by using gold-silicon eutectic bonding.

* * * * *